(12) United States Patent
Camus et al.

(10) Patent No.: US 12,142,149 B2
(45) Date of Patent: Nov. 12, 2024

(54) METHOD FOR AUTHORIZING THE FLIGHT OF AN AIRCRAFT HAVING A HYBRID POWER PLANT PROVIDED WITH AT LEAST ONE ELECTRIC MOTOR AND AT LEAST ONE HEAT ENGINE

(71) Applicants: AIRBUS HELICOPTERS, Marignane (FR); AIRBUS DEFENSE & SPACE SAS, Toulouse (FR)

(72) Inventors: Jeremy Camus, Ensues la Redonne (FR); Julien Laurent, Toulouse (FR)

(73) Assignees: AIRBUS HELICOPTERS, Marignane (FR); AIRBUS DEFENSE & SPACE SAS, Toulouse (FR)

( * ) Notice: Subject to any disclaimer, the term of this patent is extended or adjusted under 35 U.S.C. 154(b) by 0 days.

(21) Appl. No.: 18/380,252

(22) Filed: Oct. 16, 2023

(65) Prior Publication Data
US 2024/0169845 A1 May 23, 2024

(30) Foreign Application Priority Data
Nov. 21, 2022 (FR) ...................................... 2212089

(51) Int. Cl.
*G08G 5/00* (2006.01)
(52) U.S. Cl.
CPC ................... *G08G 5/0026* (2013.01)
(58) Field of Classification Search
CPC .................................................. G08G 5/0026
See application file for complete search history.

(56) References Cited

U.S. PATENT DOCUMENTS 8,789,791 B2 * 7/2014 Matasso ................ B64C 13/504
244/99.2
11,443,569 B1   9/2022 Churchill
(Continued)

FOREIGN PATENT DOCUMENTS

GB      2593417 A  *  9/2021  ................ B60L 1/02
WO  2018/171495 A1     9/2018
(Continued)

OTHER PUBLICATIONS

French Preliminary Search Report (with English Machine Translation) Dated May 15, 2023, Application No. 2212089, 12 Pages.

*Primary Examiner* — Peter D Nolan
*Assistant Examiner* — Demetra R Smith-Stewart
(74) *Attorney, Agent, or Firm* — Brooks Kushman P.C.

(57) ABSTRACT

A method for authorizing the flight of an aircraft provided with a hybrid power plant having at least one heat engine and at least one electric motor electrically connected to an electrical energy source comprising several electrical accumulators. The method comprises extracting (STP1), while on the ground, an electrical energy or an electrical power to be extracted from the electrical energy source during a predetermined time period and determining (STP2) for the electrical accumulators, respective initial values of an operating parameter, calculating (STP3) an average value from the initial values, determining (STP4) a minimum value from the measured initial values, issuing an authorization when a difference between the average value and the minimum value is less than a threshold and a prohibition when said difference between the average value and the minimum value is greater than or equal to the threshold.

17 Claims, 2 Drawing Sheets

(56) References Cited

U.S. PATENT DOCUMENTS

| | | | |
|---|---|---|---|
| 11,560,237 B2* | 1/2023 | Zoppitelli | B64D 31/12 |
| 2018/0118364 A1* | 5/2018 | Golshany | B64D 31/06 |
| 2021/0005077 A1* | 1/2021 | Harrison | B64D 45/00 |
| 2023/0211886 A1* | 7/2023 | Sevastyanov | B64D 27/24 |
| | | | 244/53 R |

FOREIGN PATENT DOCUMENTS

| | | | | |
|---|---|---|---|---|
| WO | WO-2020011380 A1 * | 1/2020 | | B64C 27/08 |
| WO | 2020/156079 A1 | 8/2020 | | |

* cited by examiner

METHOD FOR AUTHORIZING THE FLIGHT OF AN AIRCRAFT HAVING A HYBRID POWER PLANT PROVIDED WITH AT LEAST ONE ELECTRIC MOTOR AND AT LEAST ONE HEAT ENGINE

CROSS REFERENCE TO RELATED APPLICATIONS

This application claims the benefit of French patent application No. FR 2212089 filed on Nov. 21, 2022, the disclosure of which is incorporated in its entirety by reference herein.

TECHNICAL FIELD

The present disclosure relates to a method for authorizing the flight of an aircraft having a hybrid power plant provided with at least one electric motor and at least one heat engine, and an aircraft applying this method.

BACKGROUND

An aircraft may comprise a power plant provided with at least one electric motor and at least one heat engine. In particular, a rotorcraft may be provided with such a power plant for rotating at least one rotor, possibly via at least one gearbox.

An electric motor may be in the form of an electric machine that is only able to operate in a motor mode wherein the electric motor provides a mechanical power, or an electric machine that is able to operate in an electric motor mode and in an electric generator mode wherein the electric motor generates electrical energy. An electric motor is conventionally electrically connected to an electrical energy source. The electrical energy source may comprise a plurality of electrical accumulators arranged in one or more electric batteries. An electrical accumulator is also sometimes referred to as a cell.

A heat engine is an engine provided with a combustion chamber supplied with fuel and an oxidizer, such as a turboshaft engine or a piston engine, for example.

For example, a rotorcraft may comprise a heat engine and an electric motor that are each able to set a main lift rotor in motion. The purpose of the electric motor may in particular be to supply mechanical power to the main rotor in the event of failure of the heat engine. Such a rotorcraft thus combines the advantages of a single-engine rotorcraft while also offering the level of safety of a twin-engine rotorcraft by virtue of the assistance provided by the electric motor in the event of failure of the heat engine. Indeed, the electric motor can provide mechanical power to the main rotor, following the failure of the heat engine, for a period of a few minutes after the possible failure of the heat engine. This additional mechanical power may allow the rotorcraft to reach a secure landing area. When flying over a city, such a power plant may increase people's safety by possibly allowing the rotorcraft to reach a landing area situated outside the city, for example.

Using an electric motor in a power plant of an aircraft is therefore beneficial, in particular in order to optimize the safety of the aircraft in the event of failure of a heat engine. However, this electric motor requires the use of an electricity network electrically connected to the electric motor. This electricity network is in particular dimensioned in such a way that the electric motor provides the mechanical power required to carry out the planned mission. The electricity network of a hybrid rotorcraft is, for example, dimensioned so that the electric motor provides a predetermined mechanical power at the very least for a predetermined time period in the event of failure of a heat engine. However, such an electricity network is liable to be inadequate and to not allow the electric motor to fulfil the desired function.

Document WO2020/156079 A1 describes a method and a device for monitoring an electric battery of an aircraft. This method comprises acquiring values of performance parameters of the electric battery, these parameters comprising at least a number of operating cycles, the lowest electrical voltage at the terminals of a cell of the electric battery, and a difference between electrical voltages at the terminals of the cells of the electric battery. The difference between electrical voltages at the terminals of the cells of the electric battery is measured between the electrical voltage of the cell of the electric battery that has the highest electrical voltage at its terminals and the electrical voltage of the cell of the electric battery that has the lowest electrical voltage at its terminals.

The method comprises a step of determining a state identifier as a function of the values of the performance parameters, the aircraft being controlled during flight to follow a strategy that is a function of this state identifier.

Document WO2018/171495 describes a system for managing an electric battery. A management chip calculates information about the health of a cell module of the electric battery as a function of electrical current, voltage and temperature data. Document U.S. Pat. No. 11,443,569 B1 is also known.

SUMMARY

An object of the present disclosure is thus to propose a method for authorizing the flight of an aircraft provided with a hybrid power plant, with the aim of guaranteeing, before the flight, that the aircraft can perform the planned mission.

The disclosure relates to a method for authorizing the flight of an aircraft provided with a hybrid power plant, said hybrid power plant having at least one heat engine and at least one electric motor that are each able to set a mechanical system in motion, said electric motor being electrically connected to an electrical energy source comprising a number of electrical accumulators greater than or equal to two.

This method comprises the following steps:
extracting, while on the ground, an electrical energy or an electrical power to be extracted from the electrical energy source during a predetermined time period, for example by operating an electrical load and/or the electric motor;
determining, for the electrical accumulators, initial values of an operating parameter of the respective electrical accumulators;
calculating an average value from the initial values, using a controller, for example;
determining, using the controller, for example, a minimum value, said minimum value being equal to the lowest of the measured initial values; and
authorizing said aircraft to fly when a difference between the average value and the minimum value is less than a threshold and prohibiting said aircraft from flying when said difference between the average value and the minimum value is greater than or equal to the threshold, using an alerter, for example.

For example, the accumulators are configured to have identical values for a given operating parameter.

When an electrical energy or an electrical power is extracted from the electrical energy source, the electrical accumulators should, for example, have substantially identical electrical voltages at their terminals.

The extraction, while on the ground, of an electrical energy or an electrical power to be extracted from the electrical energy source during a predetermined time period may be carried out using constant electric current or constant power, or in a frequency manner.

This method can be used to determine whether the difference between the average value and the minimum value is less than a threshold. If it is, none of the electrical accumulators are faulty. The electrical energy source supplying the electric motor is therefore operational. The mission may therefore be carried out and the flight can be authorized. For example, a flight authorization signal is transmitted to an alerter and/or no flight prohibition signal is transmitted.

If it is not, the flight is not authorized. Indeed, the electrical accumulator that has the lowest value for the operating parameter is considered to be faulty because the minimum value is far from the average value. In these conditions, a flight prohibition signal is transmitted to an alerter and/or no flight authorization signal is transmitted.

According to one example, the heat engine may be used to set a rotor and/or a propeller in motion in normal conditions. The electric motor may in particular be arranged to be used in order to set the rotor and/or the propeller in motion in the event of failure of the heat engine. If the method helps detect, prior to take-off, that the electrical energy source supplying electricity to the electric motor is possibly defective, the flight is prohibited for safety reasons. The method therefore helps ensure that, prior to take-off, the electric motor is in a condition to perform its function. The method therefore makes it possible to determine that the aircraft will be able to carry out the desired mission profile prior to take-off, unlike systems that evolve a strategy during flight.

The method may comprise one or more of the following features, taken individually or in combination.

Extracting, while on the ground, of an electrical energy or an electrical power to be extracted from the electrical energy source during a predetermined time period may, according to one example, comprise operating said electric motor in motor mode.

The electric motor as such may be controlled to extract an electrical energy or an electrical power from the electrical energy source. The actual operation of the electric motor is thus assessed. This feature may also make it possible to test the electricity network connecting the electric motor to the electrical energy source, and the electric motor as such. If the electric motor is not operating according to a predetermined profile, the flight is also prohibited.

Additionally, or alternatively, extracting, while on the ground, of an electrical energy or an electrical power to be extracted from the electrical energy source during a predetermined time period may comprise operating a predetermined electrical load electrically connected to the electrical energy source.

Optionally, an electrical load that is different from the electric motor and may or may not be dedicated to this function is, in these conditions, supplied with electricity by the electrical energy source.

The electrical energy or the electrical power to be extracted during this step may be equal to a single stored value, or may result from the operation of the selected load. According to another possibility, the electrical energy or the electrical power to be extracted may be adjusted by controlling at least one electrical load, using the controller, for example, as a function of the value of at least one parameter, such as the mission to be carried out, a temperature in the electrical energy source, a state of health, a state of charge or an age of the electrical energy source.

According to one possibility compatible with the preceding possibilities, said average value is equal to the sum of the initial values divided by said number of electrical accumulators.

The average value then represents an arithmetic mean of the initial values.

According to one possibility compatible with the preceding possibilities, authorizing of a flight of the aircraft may comprise transmitting a flight authorization signal when the difference between the average value and the minimum value is less than the threshold.

According to one possibility compatible with the preceding possibilities, prohibiting the aircraft from flying may comprise transmitting a flight prohibition signal when said difference between the average value and the minimum value is greater than or equal to the threshold.

According to a first variant, the aircraft only transmits a flight authorization signal to an alerter when the difference between the average value and the minimum value is less than the threshold. The alerter then transmits an audio, visual and/or tactile alert after receiving the flight authorization signal. Therefore, if no alert is transmitted, the pilot deduces that the flight is prohibited and that a maintenance action needs to be performed.

According to a second variant, the aircraft only transmits a flight prohibition signal when said difference between the average value and the minimum value is greater than or equal to the threshold. The alerter then transmits an audio, visual and/or tactile alert after receiving the flight prohibition signal. Therefore, if no alert is transmitted, the pilot deduces that the flight is authorized.

According to a third variant, the aircraft transmits a flight authorization signal to an alerter when the difference between the average value and the minimum value is less than the threshold, the alerter generating a first audio, visual and/or tactile alert after receiving the flight authorization signal. Moreover, the aircraft transmits a flight prohibition signal when said difference between the average value and the minimum value is greater than or equal to the threshold, the alerter generating a second audio, visual and/or tactile alert different from the first alert after receiving the flight prohibition signal. Depending on the alert that is transmitted, the pilot deduces whether the flight is authorized or prohibited.

According to one possibility compatible with the preceding possibilities, the threshold may be determined during a preliminary phase by carrying out the following steps in succession:

extracting, while on the ground, electrical energy or electrical power to be extracted from the electrical energy source during the predetermined time period, and determining, for the electrical accumulators, respective reference values for said operating parameter;

rendering an electrical accumulator inoperative;

extracting, while on the ground, electrical energy or electrical power to be extracted from the electrical energy source during the predetermined time period in the presence of an electrical accumulator that has been rendered inoperative, and determining respective test values at least for the operative electrical accumulator or accumulators;

determining, for each electrical accumulator different from said electrical accumulator that has been rendered inoperative, a deviation between the reference value and the corresponding test value; and determining said threshold as a function of said deviations.

The expression "rendering an electrical accumulator inoperative" means that the electrical accumulator in question no longer supplies an electric current to an electric motor or an electrical load as described previously.

This method makes it possible to establish a threshold to be used by simulating the failure of an accumulator, for example by electrically disconnecting it from the other electrical accumulators.

According to one example, the threshold may be equal to half of the greatest deviation among the deviations.

The expression "the threshold may be equal to half of the greatest deviation among the deviations" is to be interpreted with a margin, for example 10%, i.e., "the threshold is equal to half of the greatest deviation plus or minus 10%".

This feature tends to prevent edge effects.

According to another feature, the threshold may be fixed, and determined according to the above procedure, for example.

Alternatively, the threshold may be variable.

For example, the method may comprise selecting a mission to be carried out from a list of missions, the threshold being variable as a function of the mission to be carried out.

Each mission of the list of missions may be associated with a respective threshold. The value of the threshold for each mission may be determined, for example, by following the above procedure, the electrical energy or the electrical power to be extracted thus also varying as a function of the mission.

The threshold may possibly be determined, for example by the controller, as a function of at least a parameter, such as a temperature in the electrical energy source, a state of health, a state of charge or an age of the electrical energy source. The controller may be configured to calculate the threshold as a function of the mission to be carried out parameterized with an interface, a temperature in the electrical energy source measured with a temperature sensor, a state of health of the electrical energy source assessed with a standard monitoring sensor, a state of charge of the electrical energy source assessed with a standard charge sensor, or an age of the electrical energy source assessed with a standard timer device.

According to a first alternative, said operating parameter may be an electrical voltage, each electrical voltage being measured at terminals of the associated electrical accumulator, determining, for the electrical accumulators, of respective initial values of an operating parameter being carried out during extracting, while on the ground, of an electrical energy or an electrical power to be extracted from the electrical energy source during a predetermined time period.

Indeed, a used accumulator has a lower electrical voltage than an accumulator in a good state of health. The electrical voltage may therefore represent the monitored operating parameter.

According to a second alternative, determining, for the electrical accumulators, of respective initial values of an operating parameter comprises, for each electrical accumulator: measuring a primary electrical voltage and a secondary electrical voltage at terminals of the associated electrical accumulator respectively before and after extracting, while on the ground, of an electrical energy or an electrical power to be extracted from the electrical energy source during a predetermined time period, said operating parameter being a difference between the primary electrical voltage and the secondary electrical voltage.

Indeed, a used accumulator has a greater drop in electrical voltage than an accumulator in a good state of health following an extraction.

According to a third alternative, determining, for the electrical accumulators, of respective initial values of an operating parameter comprises, for each electrical accumulator: measuring a primary electrical voltage and a secondary electrical voltage at terminals of the associated electrical accumulator respectively before and after extracting, while on the ground, of an electrical energy or an electrical power to be extracted from the electrical energy source during a predetermined time period, said operating parameter being an electric capacitance that is a function of a difference between the primary electrical voltage and the secondary electrical voltage.

The electric capacitance may be calculated in a conventional manner as a function of the primary electrical voltage and the secondary electrical voltage.

According to a fourth alternative, determining, for the electrical accumulators, of respective initial values of an operating parameter comprises, for each electrical accumulator: measuring a primary electrical voltage and a secondary electrical voltage at terminals of the associated electrical accumulator respectively before and after extracting, while on the ground, of an electrical energy or an electrical power to be extracted from the electrical energy source during a predetermined time period, said operating parameter being an electric resistance that is a function of a difference between the primary electrical voltage and the secondary electrical voltage.

The electrical resistance may be calculated in a conventional manner as a function of the primary electrical voltage and the secondary electrical voltage.

According to a fifth alternative, determining, for the electrical accumulators, of respective initial values of an operating parameter comprises, for each electrical accumulator: measuring a change in temperature inside the electrical accumulator at least during extracting, while on the ground, of an electrical energy or an electrical power to be extracted from the electrical energy source during a predetermined time period, said operating parameter being a function of said change in temperature.

For example, the operating parameter is the directing coefficient of a slope of a curve described by the measured temperature. A used accumulator has a steeper slope than an accumulator in a good state of health.

Apart from a method, the disclosure relates to a computer program comprising instructions that, when said program is run by a system, cause said system to implement this method.

Apart from a method, the disclosure also relates to an aircraft configured to implement this method. The aircraft is provided with a hybrid power plant, said hybrid power plant having at least one heat engine and at least one electric motor that are each able to set a mechanical system in motion, said electric motor being electrically connected to an electrical energy source comprising a number of electrical accumulators greater than or equal to two. The aircraft also comprises a flight authorization system configured to implement the method of the disclosure.

The flight authorization system may possibly comprise a sensor configured to at least participate in a measurement of the initial values of an operating parameter within the respective electrical accumulators, for example by measuring electrical voltages at respective terminals of the electrical accumulators or temperatures inside each electrical accumulator, a controller configured to request extracting, while on the ground, of an electrical energy or an electrical power to be extracted from the electrical energy source during a predetermined time period and to calculate the average value and the minimum value and to determine whether a difference between the average value and the minimum value is less than a threshold or is greater than or equal to the threshold, and an alerter configured to generate at least a flight authorization or a flight prohibition.

The controller and/or the sensor may be parts of the electrical energy source.

Therefore, the controller is in communication with the sensor. The sensor transmits one or more measurement signals carrying initial values, or indeed test values and/or reference values. The controller receives the measurement signal or signals in order to determine the minimum value and the average value, and indeed the abovementioned differences. The controller then compares the difference between the average value and the minimum value with a threshold. The controller consequently transmits a flight authorization signal or a flight prohibition to the alerter.

The controller or another computer may receive the measurement signal or signals in order to determine the voltage differences during a preliminary phase.

BRIEF DESCRIPTION OF THE DRAWINGS

The disclosure and its advantages appear in greater detail in the context of the following description of embodiments given by way of illustration and with reference to the accompanying figures, wherein.

DETAILED DESCRIPTION

Elements that are present in more than one of the figures are given the same references in each of them.

Figure 1:
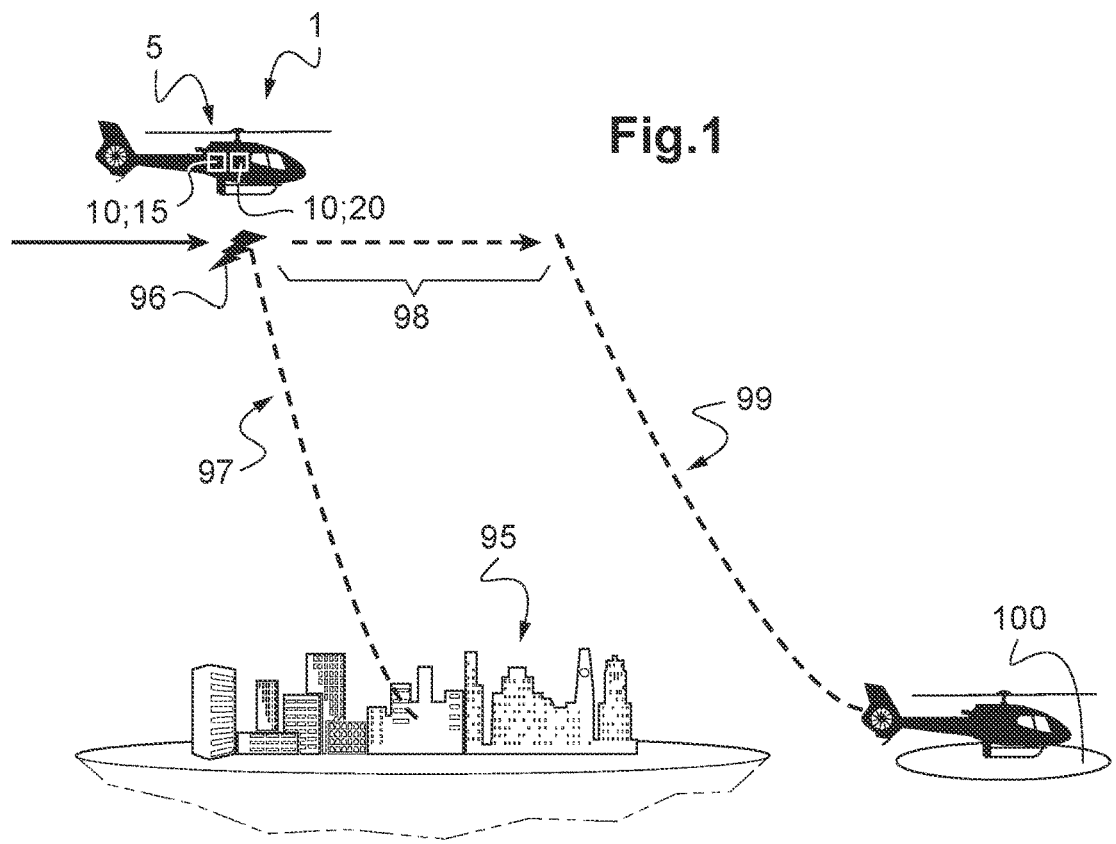
FIG. 1 is a diagram showing a mission of an aircraft according to the disclosure.

FIG. 1 shows an aircraft 1 according to the disclosure. This aircraft 1 is provided with a hybrid power plant 10. The hybrid power plant 10 comprises at least one heat engine 15 and at least one electric motor 20 that are both able to set a mechanical system 5 in motion, or indeed only a heat engine 15 and an electric motor 20. The purpose of the mechanical system 5 may be to contribute to the movement and/or the propulsion of the aircraft 1.

For example, the heat engine 15 operates by default, the electric motor 20 having the function of compensating for a failure of the heat engine 15.

On a conventional aircraft, following a failure 96 of the heat engine, the aircraft descends 97. For example, a helicopter performs autorotation flight. When flying over an urban area 95, the aircraft is likely to move towards this area.

With an aircraft 1 according to the disclosure provided with a hybrid power plant 10, following the failure 96, the electric motor 20 takes over from the heat engine 15 and sets the mechanical system 5 in motion. For a certain period of time, the aircraft 1 can continue its flight during an electrically powered flight phase 98, and then descends 99. For example, a helicopter performs autorotation flight. When flying over an urban area 95, the aircraft is likely to move away from this urban area in order to reach a secured area 100.

An aircraft 1 according to the disclosure allows a pilot to ensure that the electric motor system is operational prior to take-off.

Figure 2:
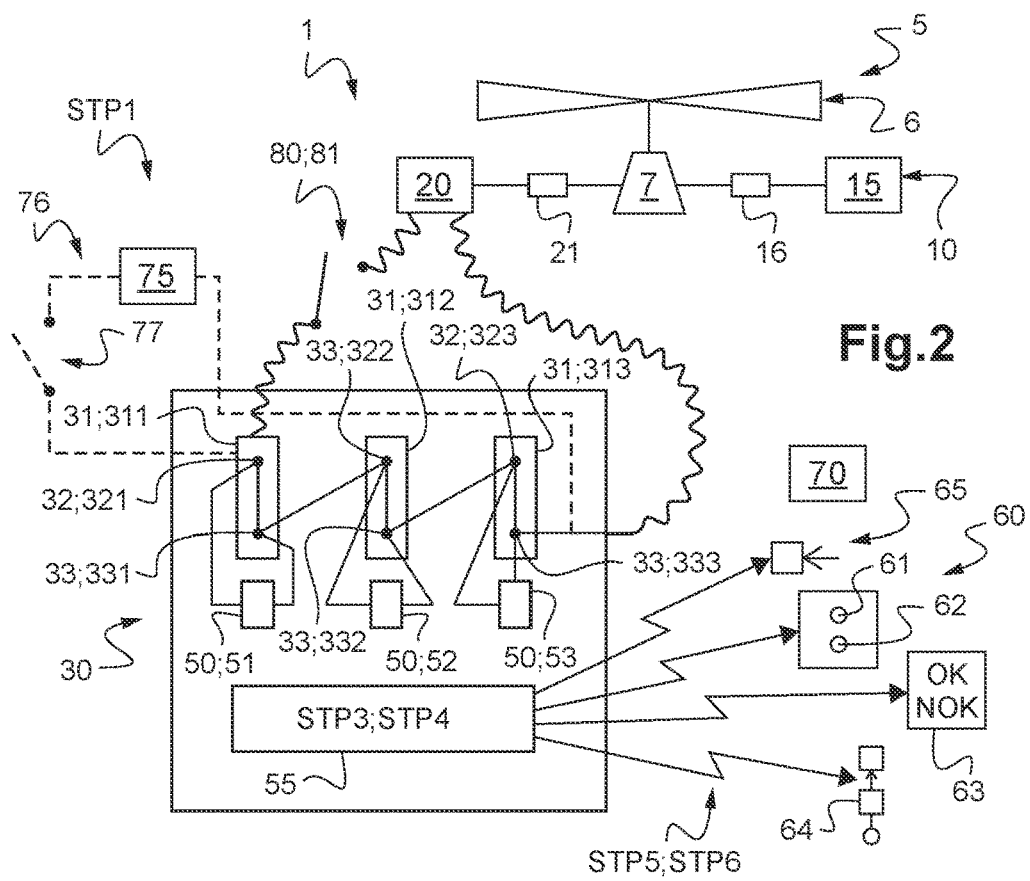
FIG. 2 is a diagram showing an aircraft according to the disclosure.

FIG. 2 shows such an aircraft 1 schematically.

The aircraft 1 is thus provided with a hybrid power plant 10. This hybrid power plant 10 comprises at least one heat engine 15 configured to set a mechanical system 5 in motion. The heat engine 15 is also supplied with fuel by at least one tank that is not shown so as not to clutter FIG. 2.

Moreover, this hybrid power plant 10 comprises at least one electric motor 20 configured to set the mechanical system 5 in motion. The electric motor 20 may be a drive member that operates only in a motor mode wherein the electric motor provides mechanical power to the mechanical system 5, or may be an electric machine capable of operating, as required, in a motor mode and an electric generator mode wherein the electric motor generates electrical energy by being set in motion by the mechanical system 5.

For example, the mechanical system 5 comprises at least one rotor 6, at least one gearbox 7, at least one free-wheel 16, 21 and/or at least one mechanical connector. A heat engine 15 may be connected via a free-wheel 16 to a gearbox 7 setting at least one rotor 6 in motion. Moreover, an electric motor 20 may be connected via a free-wheel 21 to the gearbox 7.

Moreover, the electric motor 20 is electrically connected by a motor electricity network 80 to an electrical energy source 30. The motor electricity network 80 may comprise a connection/disconnection member 81 allowing the electric motor 20 to be electrically connected to the electrical energy source 30 on command. The connection/disconnection member 81 may be in the form of a switch, a relay or the like.

The electrical energy source 30 comprises several electrical accumulators 31. The electrical accumulators 31 may be rechargeable. In particular, the electrical energy source 30 is provided with a number of electrical accumulators 31 greater than or equal to two. According to the example shown, the electrical energy source 30 is provided with three electrical accumulators 311, 312, 313.

Reference number "31" is used to denote any electrical accumulator, reference numbers 311, 312 and 313 being used as required to denote a specific electrical accumulator in order to explain the disclosure.

The electrical accumulators 31 may be electrically connected in series and/or in parallel by wired links, PCB (printed circuit board) links, welds, copper strips, etc.

The electrical accumulators 31 may be grouped together within one or several batteries.

Moreover, the aircraft 1 comprises a flight authorization system 40 configured to determine, at a minimum, whether the electrical energy source 30 is able to deliver a predetermined electric current and/or electrical power to the electric motor 20, in order for the electric motor 20 to be able to perform its function or functions.

The flight authorization system 40 may comprise a sensor 50 configured to participate in the determination of the initial values of an operating parameter of the respective electrical accumulators 31. Thus, for each electrical accumulator 31, the sensor 50 is configured to transmit one or more analog or digital signals carrying information relating to the initial value of an operating parameter within this electrical accumulator 31.

The sensor 50 may possibly be a part of an electric battery.

Sensor 50 should be understood to mean a measurement system capable of measuring the required values. Similarly, the expression "measurement" refers to both a raw measurement from a signal transmitted by a sensing device and a measurement obtained by relatively complex processing of raw measurement signals.

According to one possibility, the operating parameter may be a function of an electrical voltage, each electrical voltage being measured at terminals 32, 33 of the associated electrical accumulator 31.

Reference numbers "32" and "33" are used to denote the two terminals of any electrical accumulator 31, reference numbers 321-331, 322-332, 323-333 being used to denote the terminals of specific electrical accumulators 311, 312 and 313.

Thus, according to the example shown, the first electrical accumulator 311 comprises a first terminal 321 and a second terminal 331, the second electrical accumulator 312 comprises a first terminal 322 and a second terminal 332 and the third electrical accumulator 313 comprises a first terminal 323 and a second terminal 333. Therefore, the sensor 50 measures one electrical voltage at the terminals 321 and 331 of the first electrical accumulator 311, another electrical voltage at the terminals 322 and 332 of the second electrical accumulator 312 and another electrical voltage at the terminals 323 and 333 of the third electrical accumulator 313.

Thus, the sensor 50 may comprise, for example, one sensing device 51, 52, 53 for each electrical accumulator 311, 312, 313 for measuring electrical voltages at the terminals 321 and 331, 322 and 332, 323 and 333 of these electrical accumulators 311, 312, 313. For example, each sensing device 51, 52, 53 may be in the form of a voltmeter.

According to another possibility, said operating parameter is a function of a change in temperature within the electrical accumulator 31. The sensor 50 may then comprise one temperature sensor for each electrical accumulator.

Moreover, the flight authorization system 40 may comprise a controller 55 connected to the sensor 50 by a wired or wireless communication means and, if required, to each sensing device 51, 52, 53.

The controller 55 may be provided with one or more processing units comprising, for example, at least one processor and at least one memory, at least one integrated circuit, at least one programmable system, at least one logic circuit, these examples not limiting the scope given to the expression "processing unit". The term "processor" may refer equally to a central processing unit (CPU), a graphics processing unit (GPU), a digital signal processor (DSP), a microcontroller, etc. One or more processing units of the controller 55 may optionally be parts of an electric battery or may be located separately and may even perform other functions. One or more processing units of the controller 55 may be dedicated or not dedicated to the disclosure.

The controller 55 may also be connected to a human-machine control interface 70 by a wired and/or wireless link, directly or indirectly via other members and, for example, an avionics computer. This human-machine control interface 70 can transmit an analog or digital signal to the controller 55 to implement the method of the disclosure.

Moreover, the flight authorization system 40 may comprise an alerter 60. The alerter 60 may be connected to the controller 55 by a wired or wireless communication means. The controller 55 is configured to transmit one or more analog or digital alert signals to the alerter 60. The alerter 60 is configured to generate at least one visual, audio and/or tactile flight authorization or flight prohibition.

For example, the alerter 60 may comprise one light-emitting diode 61 that is illuminated when a flight authorization is granted by the controller 55, and/or another light-emitting diode 62 that is illuminated when a flight prohibition is transmitted by the controller 55.

For example, the alerter 60 may comprise a vibrating unit 64 that makes a member held or worn by an individual vibrate, the vibrating unit 64 being able to generate a first vibration in said member when a flight authorization is granted by the controller 55, and/or a second vibration when a flight prohibition is transmitted by the controller 55. If applicable, the first vibration and the second vibration may be different.

For example, the alerter 60 may comprise a loudspeaker 65 that can transmit a first sound when a flight authorization is granted by the controller 55, and/or a second sound when a flight prohibition is transmitted by the controller 55. If applicable, the first sound and the second sound may be different.

According to another aspect, the flight authorization system 40 may comprise an electrical load 75 electrically connected by an electricity supply network 76 to the electrical energy source 30. The electricity supply network 76 may comprise a connection/disconnection means 77 for electrically connecting the electrical load 75 to the electrical energy source 30 on command. The connection/disconnection means 77 may be in the form of a switch, a relay or the like.

If applicable, the controller 55 may be connected by a wired or wireless link to the connection/disconnection member 81 and/or the connection/disconnection means 77 described above.

Figure 3:
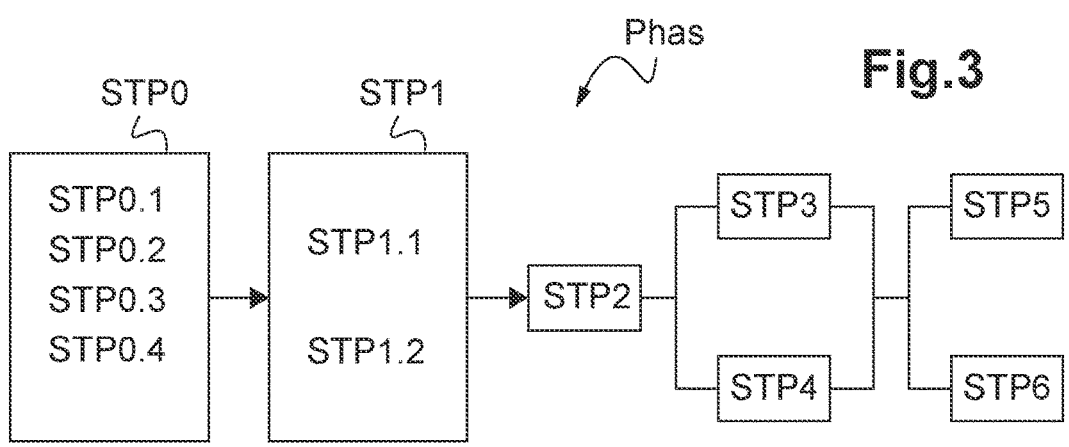
FIG. 3 is a diagram showing the method according to the disclosure.

FIG. 3 shows the method of the disclosure. This method may be implemented by a computer program comprising instructions. When said program is run by the system 40, the instructions that are run cause the system 40 to implement this method.

The method comprises a monitoring phase Phas, carried out prior to take-off, for example when the aircraft 1 is started up. The monitoring phase may possibly be launched when the human-machine control interface 70 is operated. For example, the human-machine control interface 70 transmits a command signal directly to the controller 55, or transmits a signal to a separate component that in turn transmits a command signal directly or indirectly to the controller 55.

During the monitoring phase Phas, the method comprises extracting STP1, while on the ground, an electrical energy or an electrical power to be extracted from the electrical energy source 30 during a predetermined time period.

For example, this step comprises the operation STP1.1 of the electric motor 20 in motor mode.

The controller 55 may possibly control the motor electricity network 80 so that an electric current flows between the electric motor 20 and the electrical energy source 30. For example, the controller 55 controls the connection/disconnection member 81.

Additionally, or alternatively, the controller 55 may control the electricity supply network 76 so that an electric current flows between the electrical load 75 and the electrical energy source 30. For example, the controller 55 controls the connection/disconnection means 76.

The predetermined time period may possibly be fixed or calculated, for example by the controller 55. According to one illustration, the controller 55 is configured to calculate the predetermined time period as a function of an outside temperature measured with a temperature sensing device.

Therefore, before and/or during and/or after this extraction of an electrical energy or an electrical power, the monitoring phase Phas comprises determining STP2, for the electrical accumulators 31, respective initial values Vmes for an operating parameter.

Therefore, the monitoring phase Phas comprises calculating STP3 an average value Vmoy from the initial values Vmes, using the controller 55.

According to a first alternative that can be implemented with the system of FIG. 2, the sensor 55 measures an initial electrical voltage Vmes1 at the terminals 321 and 331 of the first accumulator 311, a second initial electrical voltage Vmes2 at the terminals 322 and 332 of the second accumulator 312 and a third initial electrical voltage Vmes3 at the terminals 323 and 333 of the third accumulator 313.

For each electrical accumulator 30, the initial value Vmes may be the electrical voltage measured in real time and at a predetermined instant, or may be equal to an average of the electrical voltages measured during said predetermined time period.

The initial electrical voltages Vmes may be stored in a memory of the controller 55 or in another memory.

Therefore, the monitoring phase Phas comprises calculating STP3 an average value Vmoy from the initial electrical voltages Vmes, using the controller 55.

The average value Vmoy is, for example, equal to the sum of the initial electrical voltages Vmes divided by said number Nbr. According to the example in FIG. 2, the average value Vmoy is, for example, equal to the sum of the first electrical voltage Vmes1 and the second electrical voltage Vmes2 and the third electrical voltage Vmes3 divided by 3, i.e., Vmoy=(Vmes1+Vmes2+Vmes3)/3.

According to a second alternative that can be implemented with the system of FIG. 2, the sensor 50 measures, for each electrical accumulator 31, a primary electrical voltage and a secondary electrical voltage respectively before and after the extraction, while on the ground, of an electrical energy or an electrical power to be extracted from the electrical energy source 30 during a predetermined time period. For each electrical accumulator 31, the controller 55 calculates the associated initial value Vmes, this initial value Vmes being equal to a difference between the primary electrical voltage and the secondary electrical voltage.

The average value Vmoy is, for example, equal to the sum of the initial values Vmes divided by said number Nbr.

According to a third alternative that can be implemented with the system of FIG. 2, the sensor 50 measures, for each electrical accumulator 31, a primary electrical voltage and a secondary electrical voltage respectively before and after the extraction, while on the ground, of an electrical energy or an electrical power to be extracted from the electrical energy source 30 during a predetermined time period. For each electrical accumulator 31, the controller 55 calculates the associated initial value Vmes, this initial value Vmes being an electrical capacitance that is a function of a difference between the primary electrical voltage and the secondary electrical voltage.

The average value Vmoy is, for example, equal to the sum of the initial values Vmes divided by said number Nbr.

According to a fourth alternative that can be implemented with the system of FIG. 2, the sensor 50 measures, for each electrical accumulator 31, a primary electrical voltage and a secondary electrical voltage respectively before and after the extraction, while on the ground, of an electrical energy or an electrical power to be extracted from the electrical energy source 30 during a predetermined time period. For each electrical accumulator 31, the controller 55 calculates the associated initial value Vmes, this initial value Vmes being an electrical resistance that is a function of a difference between the primary electrical voltage and the secondary electrical voltage.

The average value Vmoy is, for example, equal to the sum of the initial values Vmes divided by said number Nbr.

According to a fifth alternative, the sensor 50 measures, for each electrical accumulator 31, a temperature inside this electrical accumulator 31 at least during, and indeed also before and/or after the extraction, while on the ground, of an electrical energy or an electrical power to be extracted from the electrical energy source 30 during a predetermined time period. For each electrical accumulator 31, the controller 55 calculates the associated initial value Vmes, this initial value Vmes being a function of said change in temperature. For example, the operating parameter is the directing coefficient of a slope of a curve described by the measured temperature.

The average value Vmoy is, for example, equal to the sum of the initial values Vmes divided by said number Nbr.

Irrespective of how the initial values Vmes and the average value Vmoy are assessed and in reference to FIG. 3, the monitoring phase Phas also comprises determining STP4 a minimum value Vmin. The controller 55 can determine the minimum value Vmin, this minimum value Vmin being equal to the lowest of the measured initial values Vmes.

Therefore, the controller 55 transmits a signal to the alerter 60 in order to generate a flight authorization for the aircraft 1 when a difference Diff between the average value Vmoy and the minimum value Vmin is less than a predetermined threshold S, and a flight prohibition for the aircraft 1 when said difference Diff is greater than or equal to the threshold S.

By way of illustration, according to the example of the first alternative and the example of FIG. 2, the first electrical voltage is equal to 2.7 Volts, the second electrical voltage is equal to 3.5 Volts and the third electrical voltage is equal to 3.4 Volts. The average electrical voltage Vmoy is then equal to 3.2 Volts and the minimum electrical voltage Vmin is equal to the first electrical voltage, i.e., 2.7 Volts.

If the threshold is fixed at 0.3 Volts, the difference between the average electrical voltage Vmoy and the minimum electrical voltage Vmin is 0.5 Volts and is greater than the threshold S. The flight is then prohibited. A maintenance action may then be triggered.

If the threshold is fixed at 0.6 Volts, the difference between the average electrical voltage Vmoy and the minimum electrical voltage Vmin is less than the threshold. The flight is then authorized.

In order to authorize the flight, the controller 55 can transmit a flight authorization signal when the difference between the value Vmoy and the minimum value Vmin is less than the threshold S. Upon receiving the flight authorization signal, the alerter 60 may then either not generate any alert, if the alerter 60 only transmits an alert in the event of prohibition, or generate an alert carrying the flight authorization.

In order to prohibit the flight, the controller 55 can transmit a flight prohibition signal when the difference between the average value Vmoy and the minimum value Vmin is greater than or equal to the threshold S. Upon receiving the flight prohibition signal, the alerter 60 may then either not generate any alert, if the alerter 60 only transmits an alert in the event of flight authorization, or generate an alert carrying the flight prohibition.

According to another aspect, the threshold may be fixed or may vary depending on the situation in question. For example, a pilot may operate a human-machine mission interface in order to select a mission to be carried out from a predetermined list of missions, the controller 55 being able to determine the value of the threshold S using a list that stores a said value of the threshold S for each mission.

According to one possibility, the controller 55 may calculate the threshold as a function of a temperature in the electrical energy source measured with a temperature sensor, a state of health of the electrical energy source assessed with a standard monitoring sensor, a state of charge of the electrical energy source assessed with a standard charge sensor, and/or an age of the electrical energy source assessed with a standard timer device.

The value of the threshold S or a law allowing this value to be calculated as a function of one or several parameters may be established by tests or simulations, for example.

In order to assess the value of the threshold S, for example for a specific mission or for certain values of certain parameters, the method may possibly comprise a preliminary phase STP0. This preliminary phase STP0 may comprise the extraction STP0.1, while on the ground, of the electrical energy or the electrical power to be extracted, as referred to above, from the electrical energy source 30 during the predetermined time period as referred to above. For example, this step STP0.1 comprises operating the electric motor 20 in motor mode or supplying electricity to an electrical load 75 as in the step STP1 described above.

The preliminary phase STP0 comprises measuring STP0.2, with the sensor 50, for the electrical accumulators 31, respective reference values Vref, each reference electrical voltage Vref according to the first alternative being measured at the terminals 32, 33 of the associated electrical accumulator 31.

The reference values Vref are stored for subsequent processing, for example in a memory of the controller 55 or another processing unit.

The preliminary phase STP0 comprises a step STP0.3 consisting in rendering an electrical accumulator 31 inoperative, for example the electrical accumulator 311 in FIG. 2, in order to assess the value of the threshold. For example, an operator modifies the wiring of the electrical energy source 30 in order to disconnect the electrical accumulator 311 in question, or the controller 55 acts on one or more switches or an equivalent in order to achieve the same effect.

Therefore, the preliminary phase STP0 comprises extracting STP0.4, while on the ground, electrical energy or electrical power to be extracted from the electrical energy source 30 during the predetermined time period in the presence of an electrical accumulator 31 that has been rendered inoperative, i.e., the first electrical accumulator 311 according to the example in question, and measuring STP0.5 respective test values Vtest for the electrical accumulators 31.

The reference steps STP0.1 and STP0.2 are reproduced with an inoperative electrical accumulator 31 in order to simulate a malfunction of the electrical energy source 30.

A processing unit and, for example, the controller 55 then determines, for each electrical accumulator 31 different from the electrical accumulator that has been rendered inoperative, a deviation between the reference value Vref and the corresponding test value Vtest.

Figure 4:
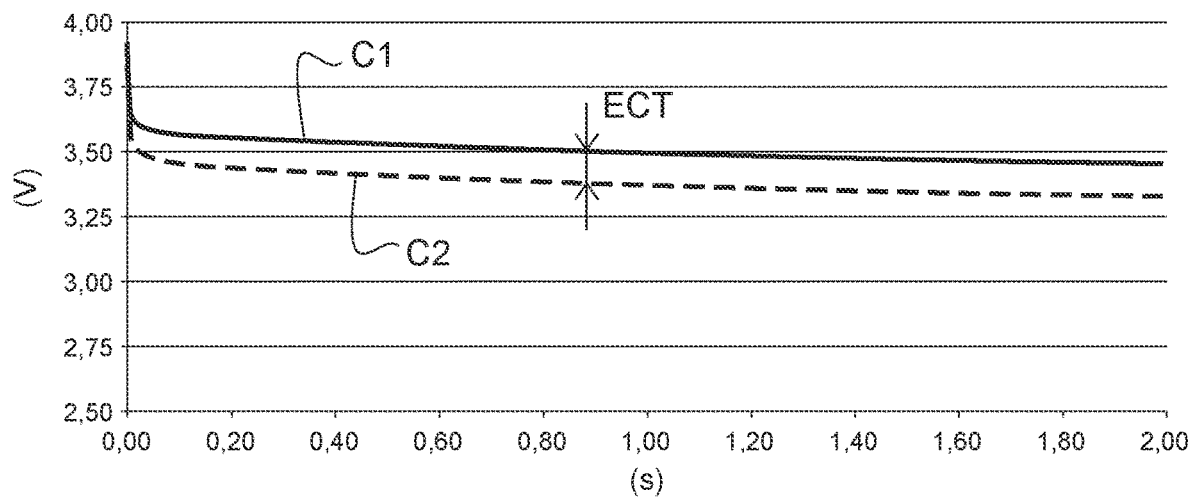
FIG. 4 is a diagram showing the determination of the value of the threshold.

FIG. 4 shows the variation in the reference electrical voltage Vref and the test electrical voltage Vtest over time in the context of the first alternative. This FIG. 4 shows time on the X-axis and electrical voltage on the Y-axis. The curve C1 represents the reference electrical voltage Vref and the curve C2 represents the test electrical voltage Vtest.

It can be seen that, at each instant, a deviation ECT separates the curve C1 and the curve C2. Indeed, in the event that an electrical accumulator 31 fails, the electrical energy or the electrical power extracted at the other electrical accumulators 31 is greater than when none of the electrical accumulators 31 has failed.

The method therefore comprises determining said threshold S as a function of said voltage deviation, for example using a processing unit or indeed the controller 55.

The threshold S may possibly be equal to half of the greatest deviation in voltage among the recorded deviations in voltage.

Naturally, the present disclosure is subject to numerous variations as regards its implementation, while remaining within the scope of the claims. Although several embodiments are described above, it should readily be understood that it is not conceivable to identify exhaustively all the possible embodiments. It is naturally possible to replace any of the means described with equivalent means without going beyond the ambit of the present disclosure and the claims.

What is claimed is:

1. A method for authorizing the flight of an aircraft provided with a hybrid power plant, the hybrid power plant having at least one heat engine and at least one electric motor that are each able to set a mechanical system in motion, the electric motor being electrically connected to an electrical energy source comprising a number of electrical accumulators greater than or equal to two, wherein the method comprises the following steps:
extracting, while the aircraft is on the ground, an electrical energy or an electrical power to be extracted from the electrical energy source during a predetermined time period;
measuring, with a sensor for the electrical accumulators, initial values of an operating parameter of the respective electrical accumulators;
calculating, with a controller in communication with the sensor, an average value from the initial values;
determining, with the controller, a minimum value, the minimum value being equal to the lowest of the measured initial values;
adjusting, by the controller, an amount of the electrical energy or the electrical power to be extracted from the electrical energy source during the predetermined time period as a function of a value of at least one parameter, the at least one parameter including a temperature in the electrical energy source, a state of charge of the electrical energy source, and an age of the electrical energy source; and
prior to take-off of the aircraft from the ground, authorizing the aircraft to fly by transmitting a flight authorization signal from the controller to an alerter when a difference between the average value and the minimum value is less than a threshold and generating with the alerter, in response to the flight authorization signal, an audio, visual, and/or tactile authorization alert for a pilot of the aircraft to deduce therefrom that the aircraft is authorized to fly, and prohibiting the aircraft from flying by transmitting a flight prohibition signal from the controller to the alerter when the difference between the average value and the minimum value is greater than or equal to the threshold and generating with the alerter, in response to the flight prohibition signal, an audio, visual, and/or tactile prohibition alert for the pilot of the aircraft to deduce therefrom that the aircraft is prohibited from flying.

2. The method according to claim 1,
wherein extracting, while the aircraft is on the ground, of an electrical energy or an electrical power to be extracted from the electrical energy source during a predetermined time period comprises operating the electric motor in motor mode so that the electric motor extracts from the electrical energy source during the predetermined time period the electrical energy or the electrical power to be extracted.

3. The method according to claim 1,
wherein extracting, while the aircraft is on the ground, of an electrical energy or an electrical power to be extracted from the electrical energy source during a predetermined time period comprises operating a predetermined electrical load electrically connected to the electrical energy source so that the predetermined electrical load extracts from the electrical energy source during the predetermined time period the electrical energy or the electrical power to be extracted.

4. The method according to claim 1,
wherein the average value is equal to the sum of the initial values divided by the number.

5. The method according to claim 1,
wherein the threshold is determined during a preliminary phase by carrying out the following steps in succession:
extracting, while the aircraft is on the ground, electrical energy or electrical power to be extracted from the electrical energy source during the predetermined time period, and determining, for the electrical accumulators, respective reference values for the operating parameter;
rendering an electrical accumulator inoperative;
extracting, while the aircraft is on the ground, electrical energy or electrical power to be extracted from the electrical energy source during the predetermined time period in the presence of an electrical accumulator that has been rendered inoperative, and determining respective test values for the operating parameter, at least for the operative electrical accumulator or accumulators;
determining, for each electrical accumulator different from the electrical accumulator that has been rendered inoperative, a deviation between the reference value and the corresponding test value; and
determining the threshold as a function of the deviations.

6. The method according to claim 5,
wherein the threshold is equal to half of the greatest deviation among the deviation.

7. The method according to claim 1,
wherein the threshold is fixed or variable.

8. The method according to claim 1,
wherein the operating parameter is an electrical voltage, each electrical voltage being measured at terminals of the associated electrical accumulator, determining, for the electrical accumulators, of respective initial values of an operating parameter being carried out during extracting, while the aircraft is on the ground, of an electrical energy or an electrical power to be extracted from the electrical energy source during a predetermined time period.

9. The method according to claim 1,
wherein determining, for the electrical accumulators, of respective initial values of an operating parameter comprises, for each electrical accumulator: measuring a primary electrical voltage and a secondary electrical voltage at terminals of the associated electrical accumulator respectively before and after extracting, while the aircraft is on the ground, of an electrical energy or an electrical power to be extracted from the electrical energy source during a predetermined time period, the operating parameter being a difference between the primary electrical voltage and the secondary electrical voltage.

10. The method according to claim 1,
wherein determining, for the electrical accumulators, of respective initial values (Vmes) of an operating parameter comprises, for each electrical accumulator: measuring a primary electrical voltage and a secondary electrical voltage at terminals of the associated electrical accumulator respectively before and after extracting, while the aircraft is on the ground, of an electrical energy or an electrical power to be extracted from the electrical energy source during a predetermined time period, the operating parameter being an electrical capacitance that is a function of a difference between the primary electrical voltage and the secondary electrical voltage.

11. The method according to claim 1,
wherein determining, for the electrical accumulators, of respective initial values of an operating parameter comprises, for each electrical accumulator: measuring a primary electrical voltage and a secondary electrical voltage respectively at terminals of the associated electrical accumulator before and after extracting, while the aircraft is on the ground, of an electrical energy or an electrical power to be extracted from the electrical energy source during a predetermined time period, the operating parameter being an electrical resistance that is a function of a difference between the primary electrical voltage and the secondary electrical voltage.

12. The method according to claim 1,
wherein determining, for the electrical accumulators, of respective initial values of an operating parameter comprises, for each electrical accumulator: measuring a change in temperature inside the electrical accumulator at least during extracting, while the aircraft is on the ground, of an electrical energy or an electrical power to be extracted from the electrical energy source during a predetermined time period, the operating parameter being a function of the change in temperature.

13. An aircraft comprising:
a hybrid power plant, the hybrid power plant having at least one heat engine and at least one electric motor that are each able to set a mechanical system in motion, the electric motor being electrically connected to an electrical energy source comprising a number of electrical accumulators greater than or equal to two; and
a flight authorization system for authorizing the flight of the aircraft, the flight authorization system comprising a controller, a sensor, and an alerter;
the controller configured to cause, while the aircraft is on the ground, an electrical energy or an electrical power to be extracted from the electrical energy source during a predetermined time period;
the controller further configured to adjust an amount of the electrical energy or the electrical power to be extracted from the electrical energy source during the predetermined time period as a function of a value of at least one parameter, the at least one parameter including a temperature in the electrical energy source, a state of charge of the electrical energy source, and an age of the electrical energy source;

the sensor configured to measure initial values of an operating parameter of the respective electrical accumulators;

the controller further configured to calculate an average value from the initial values and determine a minimum value, the minimum value being equal to the lowest of the measured initial values;

the controller further configured to authorize the aircraft to fly by transmitting a flight authorization signal to the alerter when a difference between the average value and the minimum value is less than a threshold and to prohibit the aircraft from flying by transmitting a flight prohibition signal to the alerter when the difference between the average value and the minimum value is greater than or equal to the threshold; and the alerter configured to generate, in response to the flight authorization signal, an audio, visual, and/or tactile authorization alert for a pilot of the aircraft to deduce therefrom that the aircraft is authorized to fly and to generate, in response to the flight prohibition signal, an audio, visual, and/or tactile prohibition alert for the pilot of the aircraft to deduce therefrom that the aircraft is prohibited from flying.

14. A flight authorization system for authorizing the flight of an aircraft provided with a hybrid power plant, the hybrid power plant having a heat engine and an electric motor that are each able to set a mechanical system in motion, the electric motor being electrically connected to an electrical energy source having at least two electrical accumulators, the flight authorization system comprising:

a controller configured to cause, while the aircraft is on the ground, an electrical energy or an electrical power to be extracted from the electrical energy source during a predetermined time period;

the controller further configured to adjust an amount of the electrical energy or the electrical power to be extracted from the electrical energy source during the predetermined time period as a function of a value of at least one parameter, the at least one parameter including a temperature in the electrical energy source, a state of charge of the electrical energy source, and an age of the electrical energy source;

a sensor configured to measure initial values of an operating parameter of the respective electrical accumulators;

the controller further configured to calculate an average value from the initial values and determine a minimum value, the minimum value being equal to the lowest of the measured initial values;

the controller further configured to authorize the aircraft to fly by transmitting a flight authorization signal to the alerter when a difference between the average value and the minimum value is less than a threshold and to prohibit the aircraft from flying by transmitting a flight prohibition signal to the alerter when the difference between the average value and the minimum value is greater than or equal to the threshold; and an alerter configured to generate, in response to the flight authorization signal, an audio, visual, and/or tactile authorization alert for a pilot of the aircraft to deduce therefrom that the aircraft is authorized to fly and to generate, in response to the flight prohibition signal, an audio, visual, and/or tactile prohibition alert for the pilot of the aircraft to deduce therefrom that the aircraft is prohibited from flying.

15. The flight authorization system according to claim 14 wherein:

the controller is further configured to cause the electrical energy or the electrical power to be extracted from the electrical energy source during the predetermined time period by operating the electric motor in motor mode so that the electric motor extracts from the electrical energy source during the predetermined time period the electrical energy or the electrical power to be extracted.

16. The flight authorization system according to claim 14 wherein:

the controller is further configured to cause the electrical energy or the electrical power to be extracted from the electrical energy source during the predetermined time period by operating a predetermined electrical load electrically connected to the electrical energy source so that the predetermined electrical load extracts from the electrical energy source during the predetermined time period the electrical energy or the electrical power to be extracted.

17. The flight authorization system according to claim 14 wherein:

the controller is further configured to determine the threshold by being further configured to:

cause, while the aircraft is on the ground, electrical energy or electrical power to be extracted from the electrical energy source during the predetermined time period, and to determine, for the electrical accumulators, respective reference values for the operating parameter;

render an electrical accumulator inoperative;

cause, while the aircraft is on the ground, electrical energy or electrical power to be extracted from the electrical energy source during the predetermined time period in the presence of an electrical accumulator that has been rendered inoperative, and determine respective test values for the operating parameter, at least for the operative electrical accumulator or accumulators;

determine, for each electrical accumulator different from the electrical accumulator that has been rendered inoperative, a deviation between the reference value and the corresponding test value; and determine the threshold as a function of the deviations.

* * * * *